US012796553B2

(12) United States Patent
Hsu et al.

(10) Patent No.: US 12,796,553 B2
(45) Date of Patent: Nov. 10, 2026

(54) SEMICONDUCTOR PACKAGING ASSEMBLY AND OPTO-ELECTROMECHANICAL DEVICE HAVING THE SAME

(71) Applicant: Rayprus Technology (Foshan) Co., Ltd., Foshan (CN)

(72) Inventors: Hsin-Yen Hsu, New Taipei (TW); Tzu-Li Feng, New Taipei (TW)

(73) Assignee: Rayprus Technology (Foshan) Co., Ltd., Foshan (CN)

( * ) Notice: Subject to any disclaimer, the term of this patent is extended or adjusted under 35 U.S.C. 154(b) by 454 days.

(21) Appl. No.: 18/368,744

(22) Filed: Sep. 15, 2023

(65) Prior Publication Data

US 2025/0015067 A1 Jan. 9, 2025

(30) Foreign Application Priority Data

Jul. 7, 2023 (CN) ........................ 202310838688.X

(51) Int. Cl.

*H10W 90/00* (2026.01)
*H04N 23/54* (2023.01)
*H05K 1/11* (2006.01)
*H10F 39/00* (2025.01)

(52) U.S. Cl.

CPC ............. *H10W 90/00* (2026.01); *H05K 1/111* (2013.01); *H10F 39/811* (2025.01)

(58) Field of Classification Search

CPC ...... H10F 39/804; H10F 39/806; H05K 1/111
See application file for complete search history.

(56) References Cited

U.S. PATENT DOCUMENTS

2014/0035081 A1* 2/2014 Jan ........................ H10F 39/804
257/E31.127
2014/0339668 A1 11/2014 Arima et al.
2016/0212851 A1* 7/2016 Hu ...................... H10W 70/614
2021/0313367 A1* 10/2021 Hatano ................ H10F 39/804
2022/0045112 A1 2/2022 Chen et al.

FOREIGN PATENT DOCUMENTS

CN 107492529 A 12/2017

* cited by examiner

*Primary Examiner* — Antonio B Crite
(74) *Attorney, Agent, or Firm* — ScienBiziP, P.C.

(57) ABSTRACT

A semiconductor packaging assembly includes a circuit board, at least one chip, a packaging body, and wires. The circuit board includes a first surface, a second surface opposite to the first surface, at least one receiving hole recessed from the first surface, and first welding pads on the first surface. The chip is received in the receiving hole and spaced apart from the circuit board by a gap. Each chip includes an active surface opposite to the second surface, a passive surface opposite to the active surface, and pins on the active surface. The packaging body is received in the gap and bonded to the chip and the circuit board. The wires are attached to a third surface of the packaging body opposite to the second surface and each wire is electrically connected to at least one of the pins and at least one of the first welding pads.

12 Claims, 20 Drawing Sheets

1000

SEMICONDUCTOR PACKAGING ASSEMBLY AND OPTO-ELECTROMECHANICAL DEVICE HAVING THE SAME

FIELD

The subject matter herein generally relates to a technical field of semiconductor packaging, and in particular to a semiconductor packaging assembly and an opto-electromechanical device having the semiconductor packaging assembly.

BACKGROUND

Semiconductor packaging methods mainly include Chips On Board (COB), Flip Chip, and Chip Scale Package (CSP). COB packaging technology is to first bond a chip on a surface of a circuit board, wires are used to electrically connect the chip and pads on the circuit board. Flip Chip packaging technology is to plant gold balls on pads of the chip first, and then bond the gold balls to pads on the circuit board. CSP packaging technology is to first 3D package the chip, and then solder balls are planted under the chip, and the chip is soldered to the circuit board through the solder balls. However, the existing chip packaging structure is not conducive to further miniaturization of the entire structure.

Therefore, there is room for improvement within the art.

BRIEF DESCRIPTION OF THE DRAWINGS

Implementations of the present disclosure will now be described, by way of embodiments, with reference to the attached figures.

DETAILED DESCRIPTION

Figure 1:
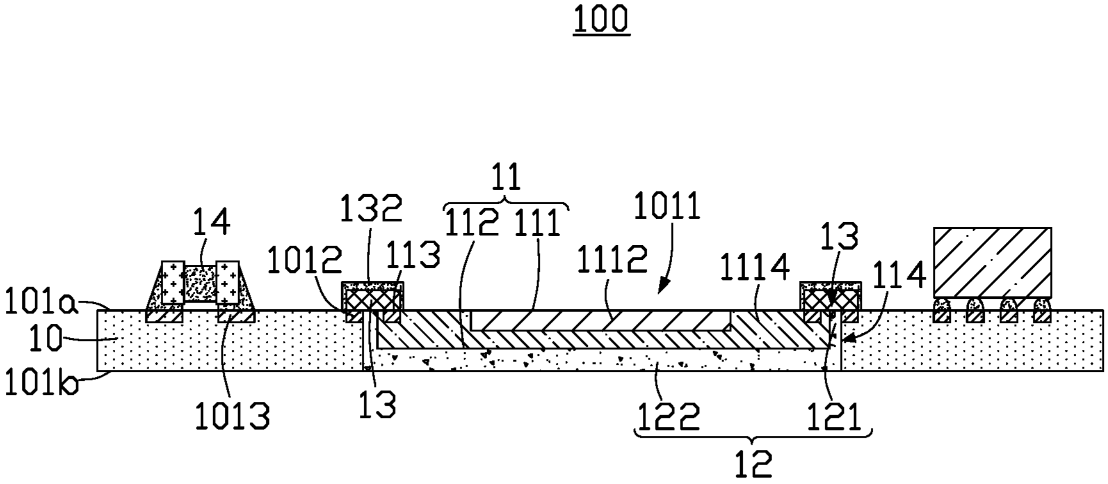
FIG. 1 is a cross-sectional view illustrating a semiconductor packaging assembly according to a first embodiment of the present disclosure.

It will be appreciated that for simplicity and clarity of illustration, where appropriate, reference numerals have been repeated among the different figures to indicate corresponding or analogous elements. In addition, numerous specific details are set forth in order to provide a thorough understanding of the embodiments described herein. However, it will be understood by those of ordinary skill in the art that the embodiments described herein can be practiced without these specific details. In other instances, methods, procedures, and components have not been described in detail so as not to obscure the related relevant feature being described. Also, the description is not to be considered as limiting the scope of the embodiments described herein. The drawings are not necessarily to scale, and the proportions of certain parts may be exaggerated to better illustrate details and features of the present disclosure.

The disclosure is illustrated by way of example and not by way of limitation in the figures of the accompanying drawings, in which like references indicate similar elements. It should be noted that references to "an" or "one" embodiment in this disclosure are not necessarily to the same embodiment, and such references mean "at least one."

The term "comprising," when utilized, means "including, but not necessarily limited to"; it specifically indicates open-ended inclusion or membership in the so-described combination, group, series, and the like.

Figure 2:
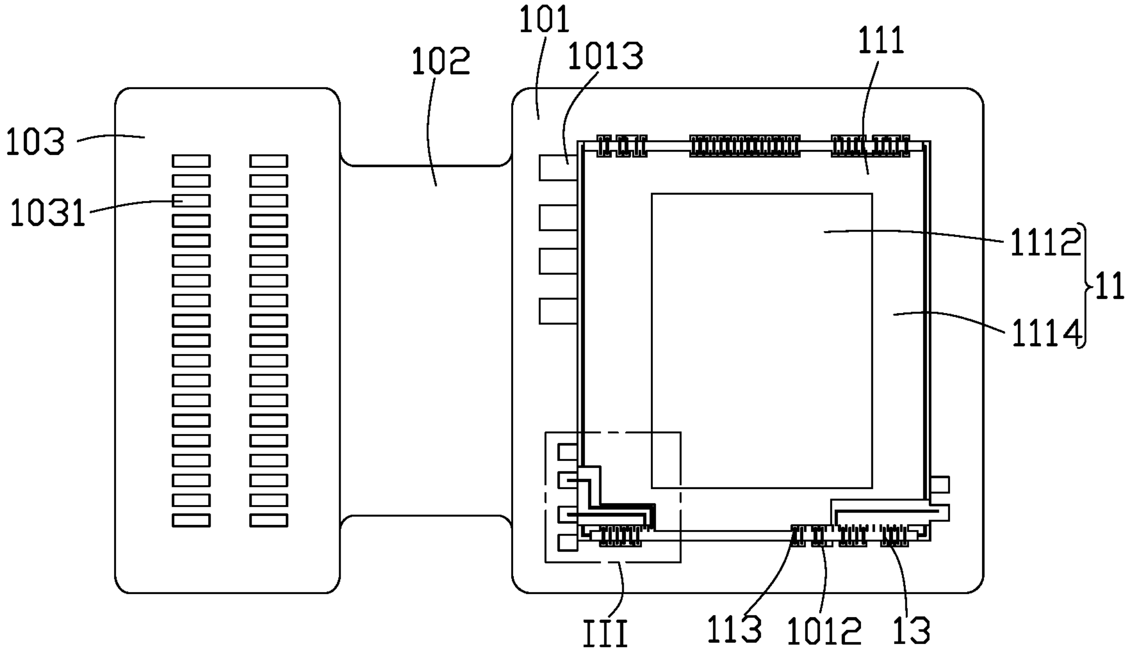
FIG. 2 is a diagram illustrating the semiconductor packaging assembly according to the first embodiment of the present disclosure.
Figure 3:
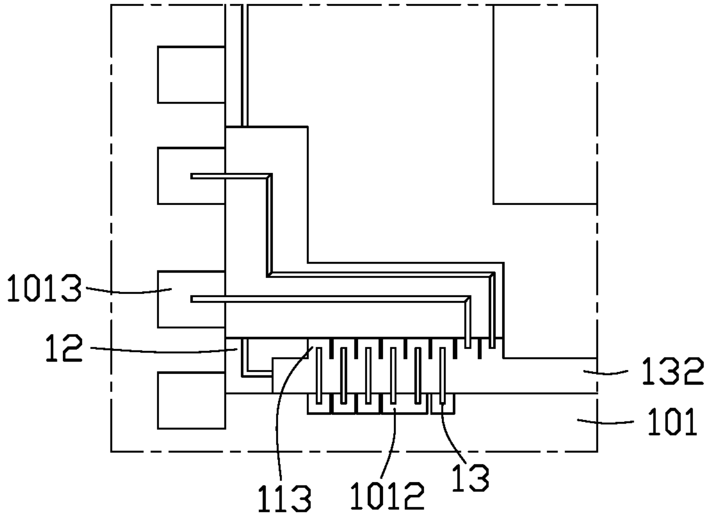
FIG. 3 is an enlarger schematic diagram illustrating a partial area III of the semiconductor packaging assembly in FIG. 2.

FIG. 1 illustrates a first embodiment of a semiconductor packaging assembly 100. Referring to FIG. 1, FIG. 2, and FIG. 3, the semiconductor packaging assembly 100 includes a circuit board 10, at least one chip 11, a packaging body 12, and wires 13. The circuit board 10 includes a first surface 101*a* and a second surface 101*b* facing the first surface 101*a*. At least one receiving hole 1011 penetrating the first surface 101*a* and the second surface 101*b* is defined by an inner surface of the circuit board 10. A plurality of first welding pads 1012 are provided on the first surface 101*a* of the circuit board 10. The at least one chip 11 is received in the at least one receiving hole 1011 and spaced from the inner surface of the circuit board 10 by a gap 114. Each of the at least one chip 11 includes an active surface 111 facing away from the second surface 101*b* and a passive surface 112 facing away from the active surface 111. The active surface 111 is provided with a plurality of pins 113. The packaging body 12 is received in the gap 114 and bonded to the at least one chip 11 and the inner surface of the circuit board 10. Each of the wires 13 is attached to a third surface 121 of the packaging body 12 facing away from the second surface 101*b*, and each of the wires 13 is electrically connected to at least one of the plurality of pins 113 of the at least one chip 11 and at least one of the plurality of first welding pads 1012 of the circuit board 10. The above structure facilitates the miniaturization and stability of the semiconductor packaging assembly 100.

In at least one embodiment, the plurality of first welding pads 1012 may be arranged at an edge of the first surface 101*a* close to the at least one chip 11. The active surface 111 of the at least one chip 11, the first surface 101*a* of the circuit board 10, and the third surface 121 of the packaging body 12 may be flush with each other. The active surface 111 may include a sensing region 1112 and a non-sensing region 1114. The non-sensing region 1114 may surround the sensing region 1112 and extend from a periphery of the sensing region 1112. The sensing region 1112 may be located at a center of the active surface 111. The plurality of pins 113 may be arranged at an edge of the non-sensing region 1114 away from the sensing region 1112. Each of the plurality of pins 113 may be adjacent to one of the plurality of first welding pads 1012. The above structure further facilitates the miniaturization and stability of the semiconductor packaging assembly 100.

In at least one embodiment, the circuit board 10 may be a rigid-flex board. The circuit board 10 includes a first rigid portion 101, a flexible portion 102, and a second rigid portion 103. Each of the at least one receiving hole 1011 penetrates the first rigid portion 101. A surface of the second rigid portion 103 may be provided with at least one electrical connector 1031. Each of the at least one chip 11 may be an image sensor, a light emitter or a light reflector.

In at least one embodiment, the circuit board 10 may be a rigid circuit board, a flexible circuit board.

The semiconductor packaging assembly 100 may further include at least one electronic component 14. A second welding pad 1013 corresponding one of the at least one electronic component 14 may be provided on the first surface 101*a* of the circuit board 10 for soldering to the electronic component 14.

In at least one embodiment, the packaging body 12 may further cover the passive surface 112 of the at least one chip 11. The packaging body 12 further includes a fourth surface 122 facing away from the third surface 121. The fourth surface 122 of the packaging body 12 may be flush with the second surface 101*b* of the circuit board 10.

In at least one embodiment, the semiconductor packaging assembly 100 may further include an insulating layer 132. The insulating layer 132 covers the wires 13 and is bonded to the third surface 121. Each of the wires 13 may be located between the insulating layer 132 and the third surface 121, so that the wires 13 can be protected and the flatness of the surface of the semiconductor packaging assembly 100 can be improved, thereby improving the conduction reliability of the wires 13.

In the semiconductor packaging assembly 100, the at least one chip 11 is placed in the at least one receiving hole 1011 of the circuit board 10 and protected by the packaging body 12 in the receiving hole 1011 of the circuit board 10, which can effectively reduce a height of the semiconductor packaging assembly 100, and provide a flat and highly consistent pixel plane, so that the imaging quality may be effectively improved. Moreover, the at least one chip 11 and the circuit board 10 are electrically connected through the plane wires 13, which is beneficial to effectively reduce stray light and improve imaging quality.

In addition, since the first welding pad 1012 and the pin 113 are adjacently arranged so as to realize a short-distance conduction between the first welding pad 1012 and the pin 113, thereby providing the at least one electronic component 14 with a larger layout space, so that the at least one electronic component 14 may be closer to the at least one chip 11 and have better electrical properties. As a result, a size of the entire semiconductor package assembly 100 is smaller and thinner.

Figure 4:
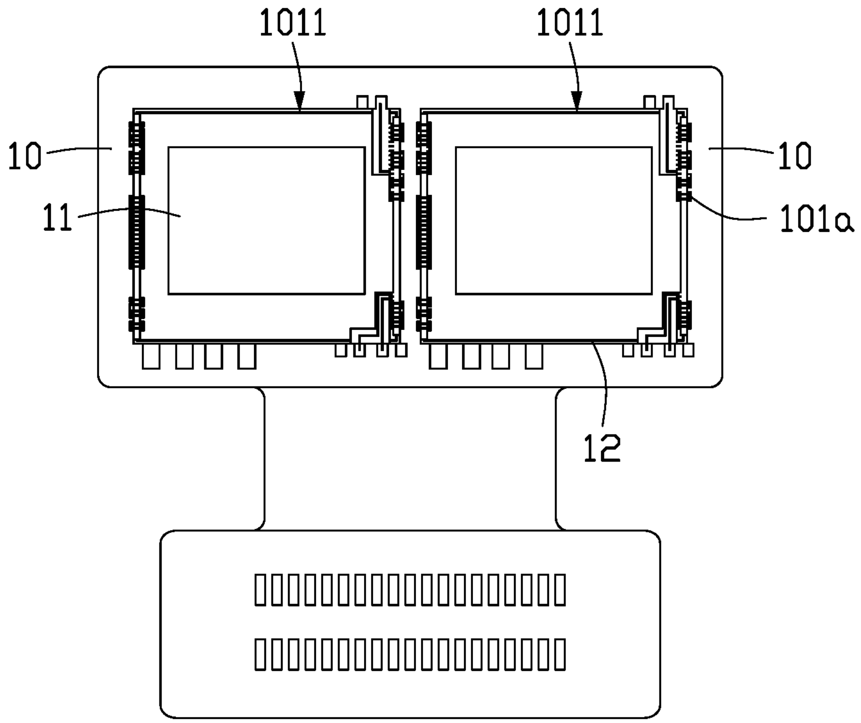
FIG. 4 a diagram illustrating a semiconductor packaging assembly according to another embodiment of the present disclosure.
Figure 5:
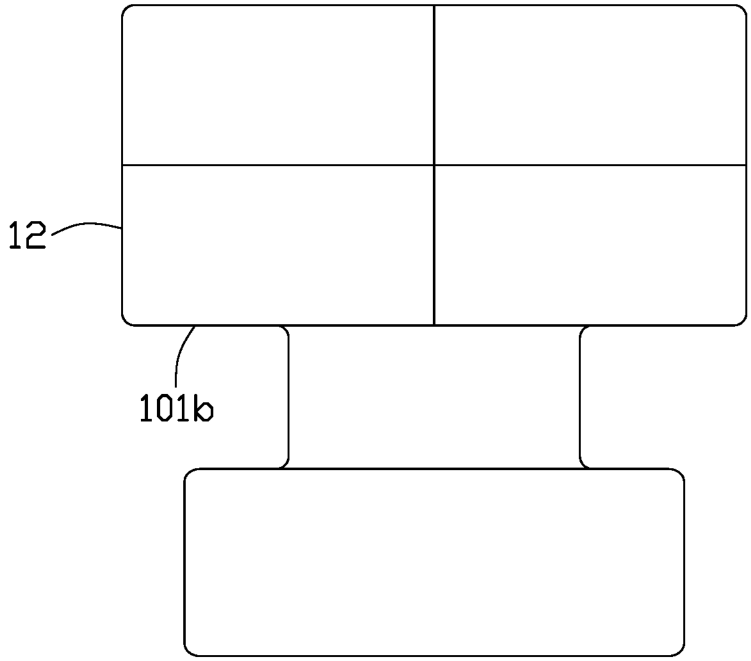
FIG. 5 is a diagram illustrating the semiconductor packaging assembly from another angle in FIG. 4.

Referring to referring to FIG. 4 and FIG. 5, in at least one embodiment, two or more receiving holes 1011 are provided, and two or more chips 11 are provided. The sizes and the shapes of the receiving holes 1011 may be the same or different, respectively. The types of the chips 11 may also be the same or different.

In at least one embodiment, the packaging body 12 may further cover the entire second surface 101*b* of the circuit board 10, so as to serve as a reinforcing layer of the circuit board 10.

Figure 6:
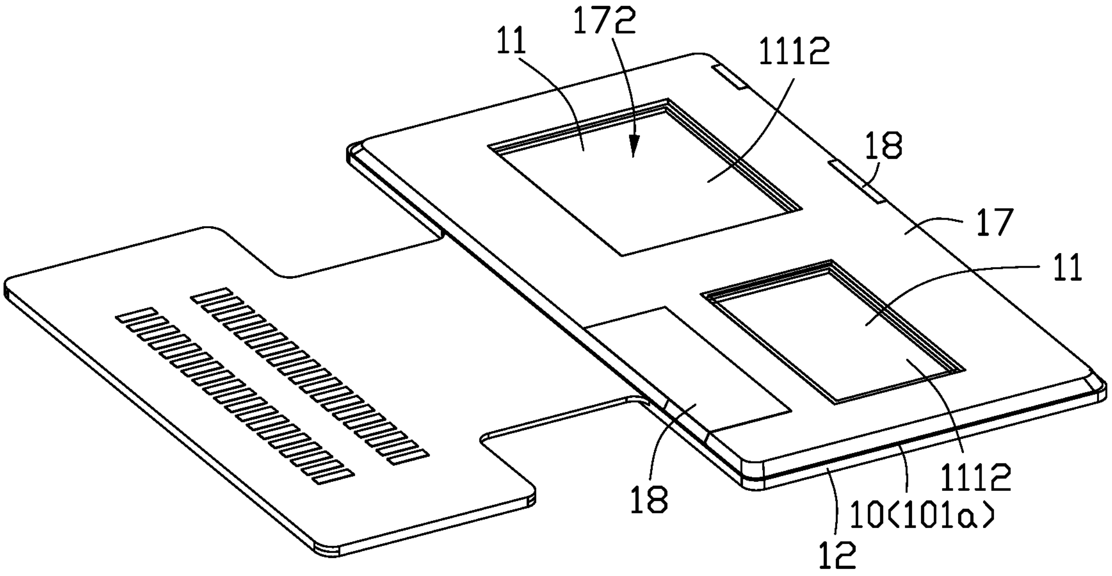
FIG. 6 a diagram illustrating a semiconductor packaging assembly according to yet another embodiment of the present disclosure.

Referring to FIG. 6, in at least one embodiment, the first surface 101*a* of the circuit board 10 may also be provided with a sealing body 17 wrapped the at least one electronic component 14 and the non-sensing region 1114. An opening 172 penetrating the sealing body 17 is provided to expose the sensing region 1112. In at least one embodiment, at least one planar thin film pad 18 electrically connected to the circuit board 10 may be provided on a surface of the sealing body 17. The thin film pad 18 may be used for subsequent connection to the voice coil motor, or the thin film pad 18 may be used as a heat dissipation pad for deriving heat source and/or an electromagnetic shielding pad for grounding. By arranging the sealing body 17 to protect the non-sensing region 1114 of the chip 11, the subsequent encapsulation area may be expanded, and the length and width of the final opto-electromechanical device can be reduced.

Figure 7:
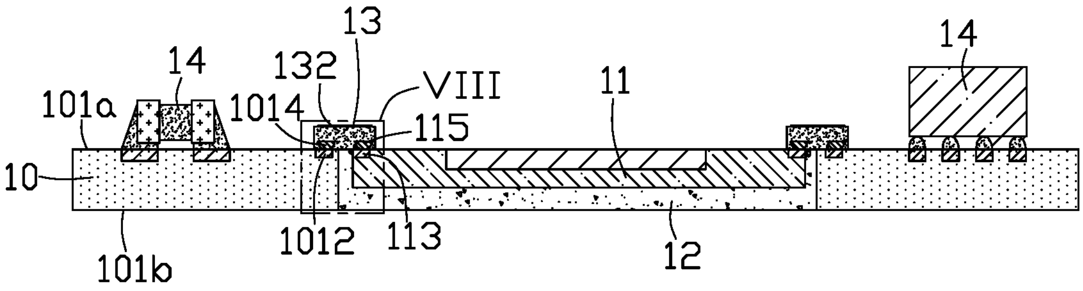
FIG. 7 is a cross-sectional view illustrating a semiconductor packaging assembly according to yet another embodiment of the present disclosure.
Figure 8:
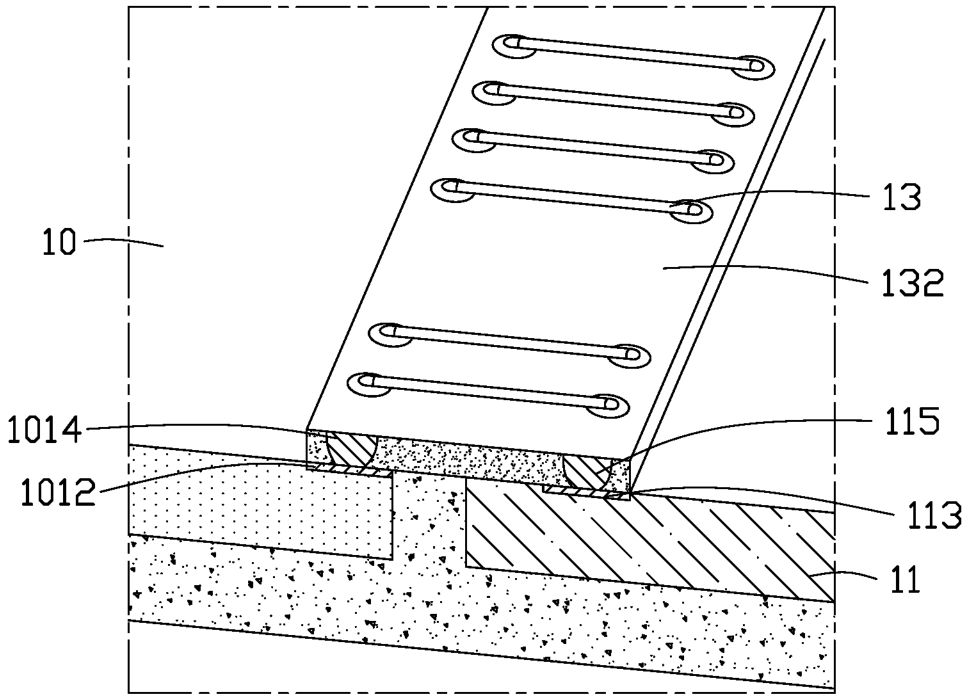
FIG. 8 is an enlarger schematic diagram illustrating a partial area VIII of the semiconductor packaging assembly in FIG. 7.

Referring to FIG. 7 and FIG. 8, in at least one embodiment, a surface of each of the plurality of first welding pads 1012 facing away from the second surface 101*b* may also be provided with a first metal block 1014, a surface of each of the plurality of pins 113 facing away from the second surface 101*b* may also be provided with a second metal block 115. The insulating layer 132 may cover the plurality of first welding pads 1012 and the plurality of pins 113, and wrap the first metal blocks 1014 and the second metal blocks 115. An end portion of the first metal block 1014 facing away from the plurality of first welding pads 1012 and an end portion of the second metal block 115 facing away from the plurality of pins 113 may be exposed from a surface of the insulating layer 132 facing away from the circuit board 10. The wires 13 may be arranged on the surface of the insulating layer 132 facing away from the circuit board 10, and each of the wires 13 electrically connects the end portion of the first metal block 1014 exposed from the insulating layer 132 and the end portion of the second metal block 115 exposed from the insulating layer 132.

The first metal block 1014 and the second metal block 115 may be gold balls. By first arranging the first metal block 1014 and the second metal block 115 and wrapping the first metal block 1014 and the second metal block 115 by the insulating layer 132, and then arranging the wires 13, which is conducive to improving the conduction reliability. In at least one embodiment, the surface of the insulating layer 132 facing away from the circuit board 10 may be planarized by grinding and polishing.

Figure 9:
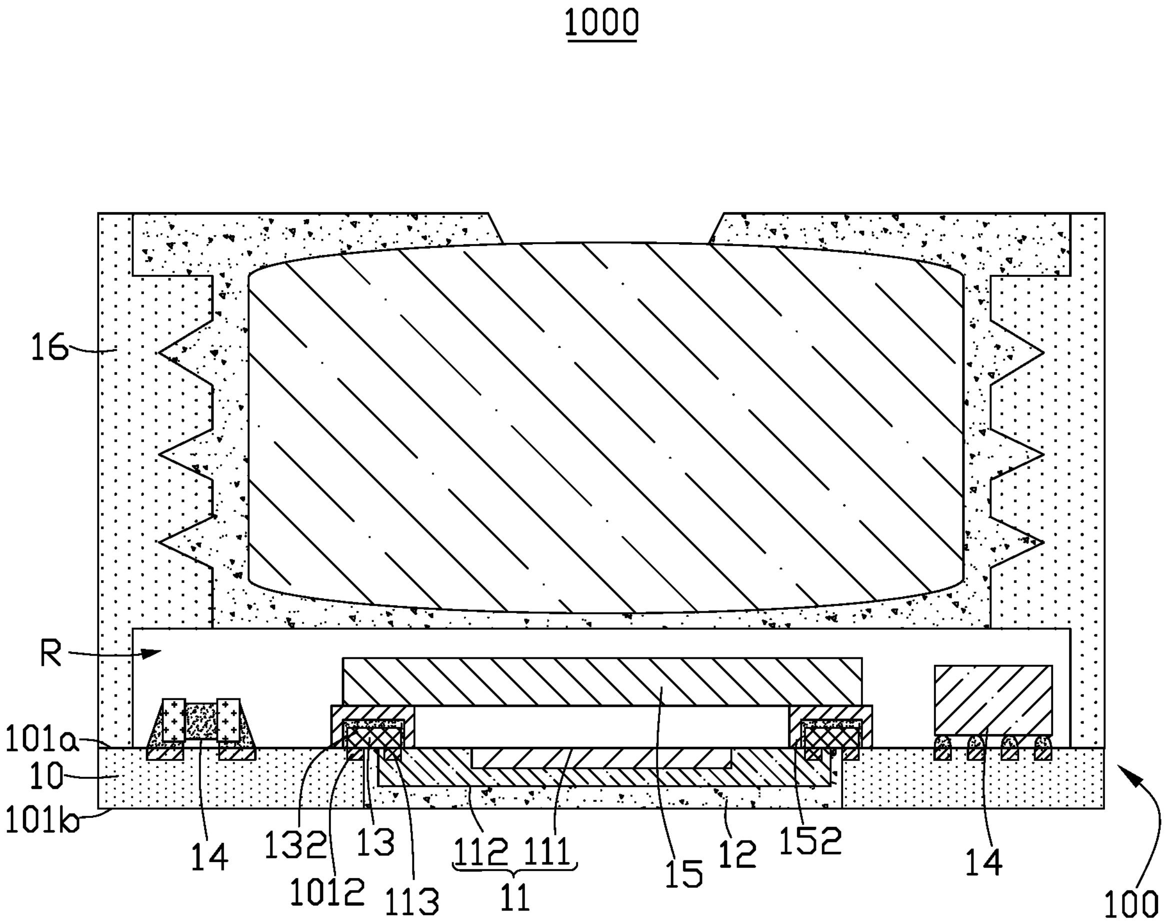
FIG. 9 is a cross-sectional view illustrating an opto-electromechanical device according to a first embodiment of the present disclosure.

FIG. 9 illustrates a first embodiment of an opto-electromechanical device 1000 having the semiconductor packaging assembly 100. The opto-electromechanical device 1000 further includes an optical element 15, a colloid 152 and a lens assembly 16. The colloid 152 covers the wires and the insulating layer 132. The optical element 15 is bonded to a junction of the circuit board 10 and the at least one chip 11 through the colloid 152, and the optical element 15 is spaced apart from the at least one chip 11. The lens assembly 16 is provided on the first surface 101*a* of the circuit board 10, and a receiving cavity R is defined by the circuit board 10 and the lens assembly 16. The optical element 15 and the at least one electronic component 14 are received in the receiving cavity R.

The opto-electromechanical device 1000 may be a camera. The optical element 15 may be an infrared cutting filter, and the at least one chip 11 may be an image sensor. The lens assembly 16 may include a voice coil motor, a lens barrel, and a lens. By bonding the optical element 15 at the junction of the at least one chip 11 and the circuit board 10, the size of the opto-electromechanical device 1000 in the length and width direction may be effectively reduced.

Figure 10A:
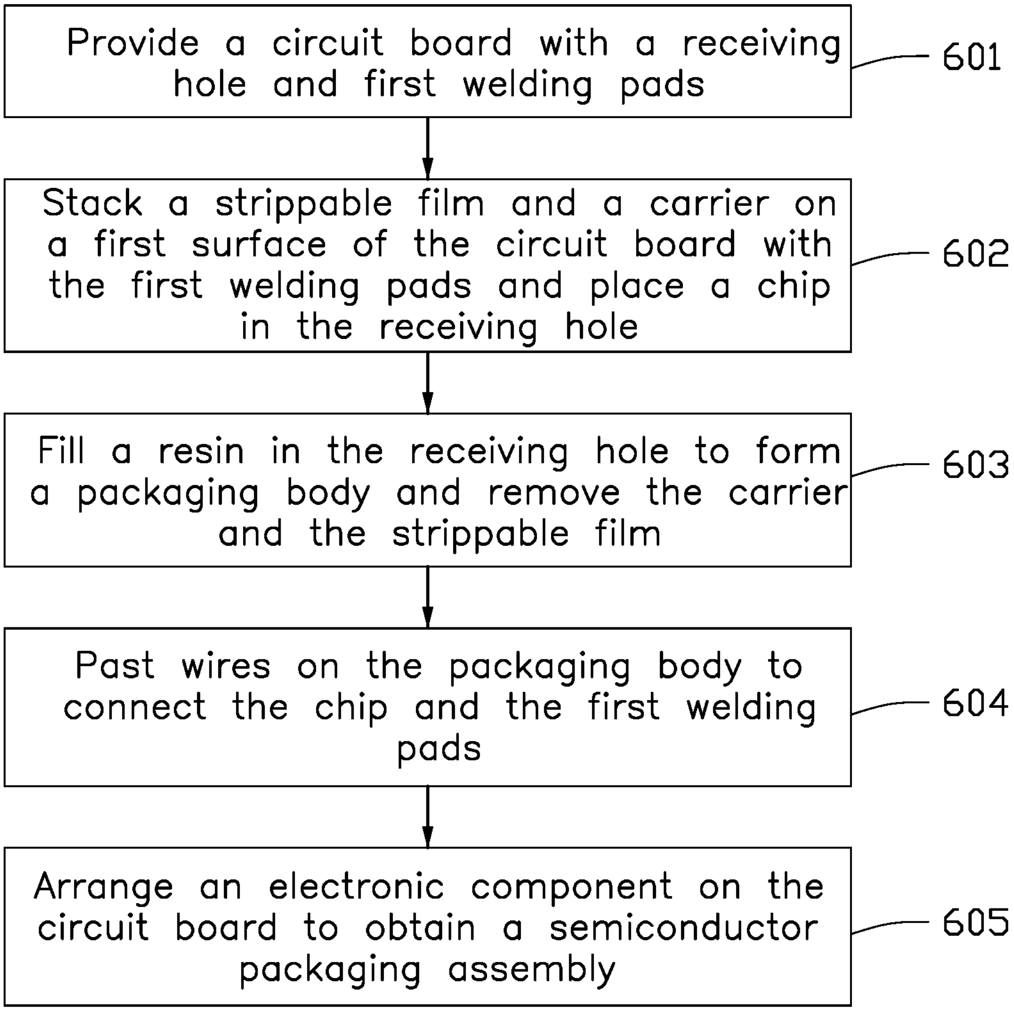
FIG. 10A is a flowchart illustrating a method for manufacturing a semiconductor packaging assembly according to a first embodiment of the present disclosure.

FIG. 10A illustrates a flowchart of a method in accordance with a first embodiment. The first embodiment method for manufacturing a semiconductor packaging assembly 100 (shown in FIG. 1) is provided by way of embodiments, as there are a variety of ways to carry out the method. Each block shown in FIG. 10A represents one or more processes, methods, or subroutines carried out in the method. Furthermore, the illustrated order of blocks can be changed. Additional blocks may be added or fewer blocks may be utilized, without departing from this disclosure. The method can begin at block 601.

Figure 10B:
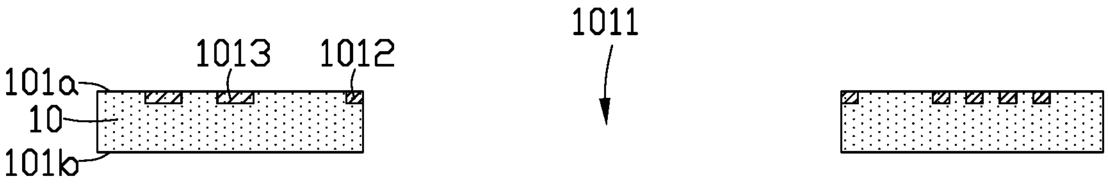
FIG. 10B is a cross-sectional view illustrating a circuit board according to a first embodiment of the present disclosure.

At block 601, referring to FIG. 10B, a circuit board 10 is provided and at least one receiving hole 1011 penetrates the circuit board 10. A plurality of the first welding pads 1012 are provided on a surface of the circuit board 10.

Figure 11:
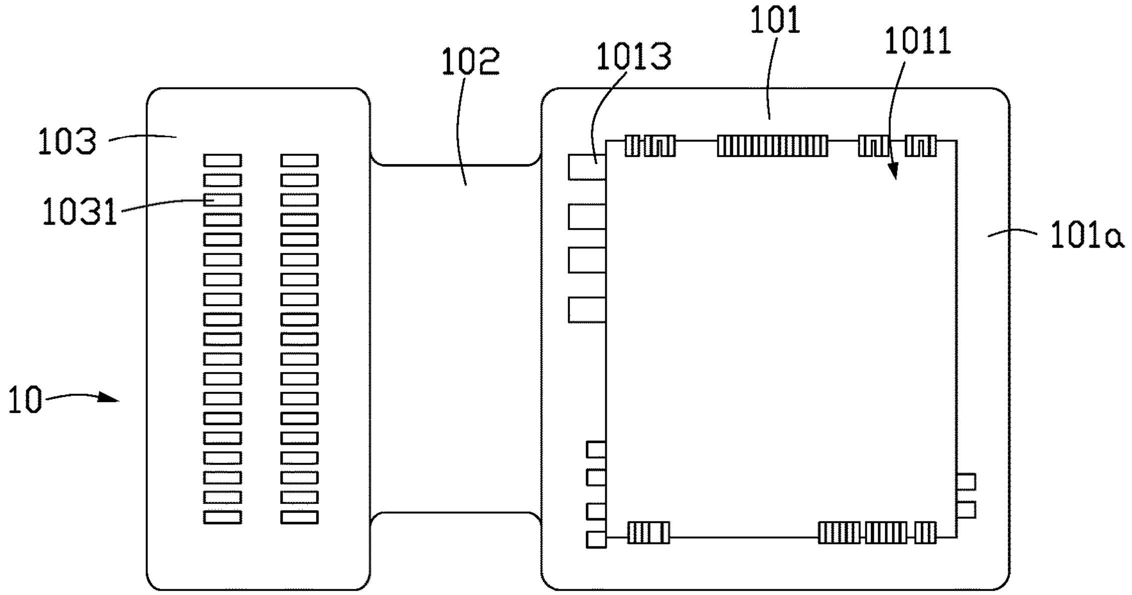
FIG. 11 is a diagram illustrating a circuit board according to a first embodiment of the present disclosure.

Referring to FIG. 11, in at least one embodiment, the circuit board 10 may be a rigid-flex board. The circuit board 10 includes a first rigid portion 101, a flexible portion 102, and a second rigid portion 103. The first rigid portion 101 includes a first surface 101*a* and a second surface 101*b* facing away from the first surface 101*a*. The receiving hole 1011 penetrates the first surface 101*a* and the second surface 101*b*. The plurality of the first welding pads 1012 are arranged on the first surface 101*a*. A surface of the second rigid portion 103 may be provided with at least one electrical connector 1031.

In at least one embodiment, the circuit board 10 may be a rigid circuit board, a flexible circuit board.

At least one second welding pad 1013 may be provided on the first surface 101*a* and spaced apart from the plurality of the first welding pads 1012.

Figure 12:
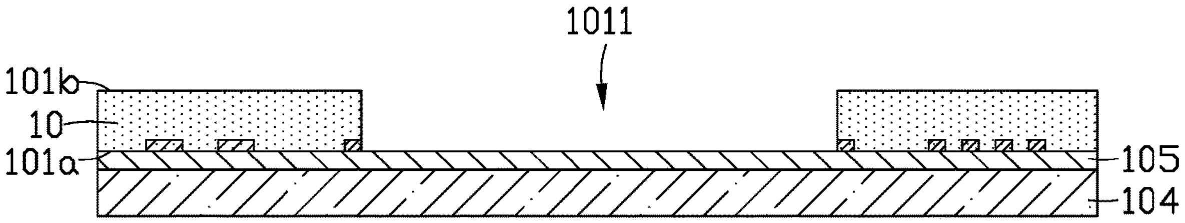
FIG. 12 is a cross-sectional view illustrating a carrier stacked with the circuit board in FIG. 10B.
Figure 13:
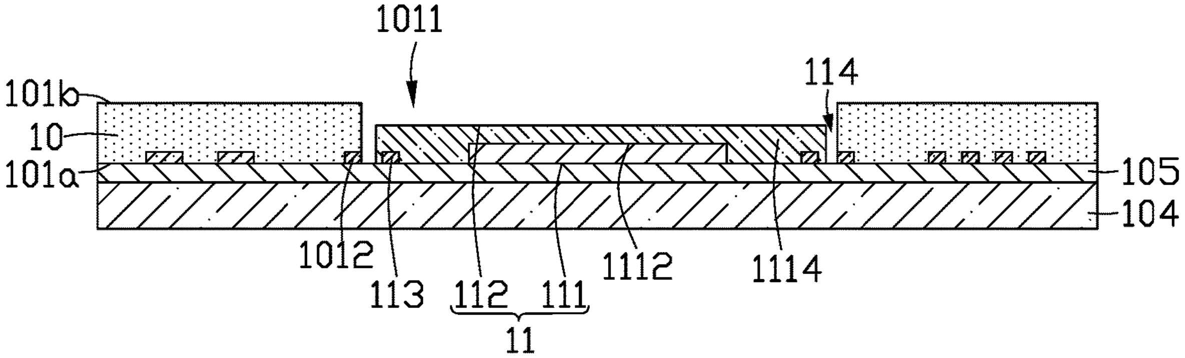
FIG. 13 is a cross-sectional view illustrating a chip in a receiving hole in FIG. 12.

At block 602, referring to FIG. 12 and FIG. 13, a carrier 104 is stacked on the first surface 101*a* of the circuit board 10, a strippable film 105 is sandwiched between the circuit board and the carrier 104, and then at least one chip 11 is placed in the at least one receiving hole 1011.

Each of the at least one chip 11 includes an active surface 111 facing the strippable film 105 and a passive surface 112 facing away from the active surface 111. The active surface 111 may include a sensing region 1112 and a non-sensing region 1114. The non-sensing region 1114 may surround the sensing region 1112 and extend from a periphery of the sensing region 1112. The non-sensing region 1114 may be provided with a plurality of pins 113 spaced apart from each other. The sensing region 1112 may be located at a center of the active surface 111. The plurality of pins 113 may be arranged at an edge of the non-sensing region 1114 away from the sensing region 1112. Each of the plurality of pins 113 may be adjacent to one of the plurality of first welding pads 1012. Each of the at least one chip 11 may be a Known Good Die (KGD), which may be placed in the receiving hole 1011 by taking calibration alignment from a single or multiple wafers.

The at least one chip 11 received in the at least one receiving hole 1011 is spaced from the circuit board 10 by a gap 114. In at least one embodiment, the plurality of first welding pads 1012 may be arranged at an edge of the first surface 101*a* close to the at least one chip 11.

Figure 14:
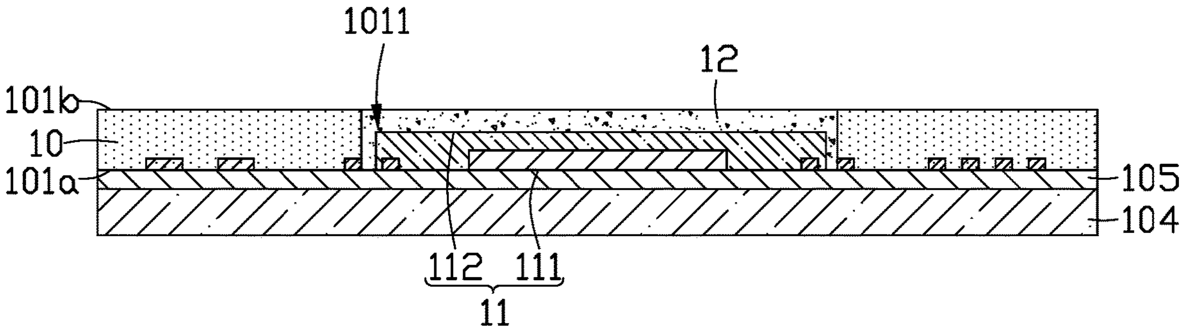
FIG. 14 a cross-sectional view illustrating a packaging body in the receiving hole in FIG. 13.
Figure 15:
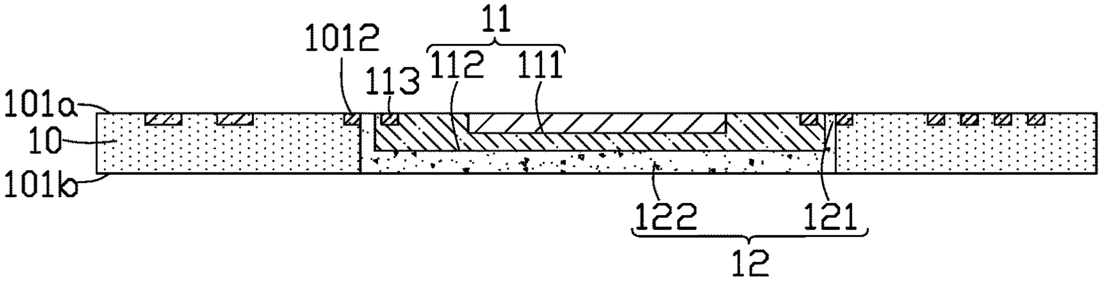
FIG. 15 is a cross-sectional view illustrating the circuit board with the chip and the packaging body after removing the carrier in FIG. 14.

At block 603, referring to FIG. 14 and FIG. 15, a resin is filled in the gap 114 to form a packaging body 12, and the carrier 104 and the strippable film 105 are removed from the circuit board 10.

The packaging body 12 may be formed in the gap 114 by an injection molding process. The packaging body 12 is bonded to the at least one chip 11 and an inner surface of the circuit board 10 defining the receiving hole 1011.

In at least one embodiment, the packaging body 12 may further cover the passive surface 112 of the at least one chip 11, so that the at least one chip 11 may be firmly fixed in the receiving hole 1011, thereby strengthening the structural strength.

The packaging body 12 includes a third surface 121 facing away from the second surface 101*b* and a fourth surface 122 facing away from the third surface 121. The third surface 121 of the packaging body 12, the active surface 111 of the at least one chip 11, and the first surface 101*a* of the circuit board 10 may be flush with each other.

The fourth surface 122 of the packaging body 12 may be flush with the second surface 101*b* of the circuit board 10.

Figure 16:
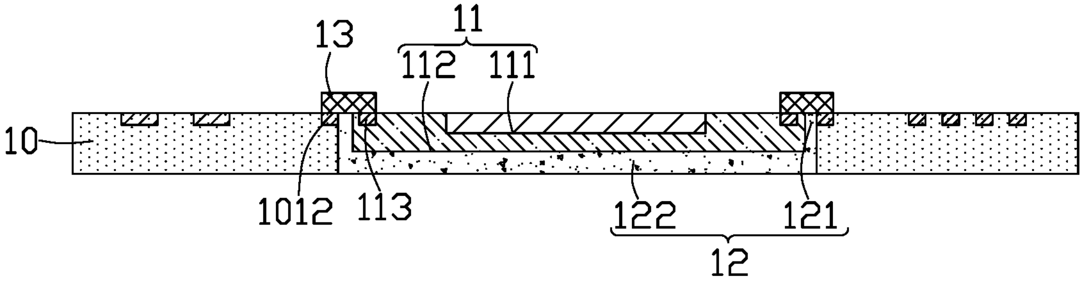
FIG. 16 is a cross-sectional view illustrating wires connecting a first welding pad and a pin in FIG. 15.

At block 604, referring to FIG. 16, wires 13 are pasted on the third surface 121 of the packaging body 12, and each of the wires 13 electrically connects one of the plurality of pins 113 and one of the plurality of first welding pads 1012.

A flat conduction film line, that is, the wire 13 may be formed on the third surface 121 by spraying conductive material.

Figure 17:
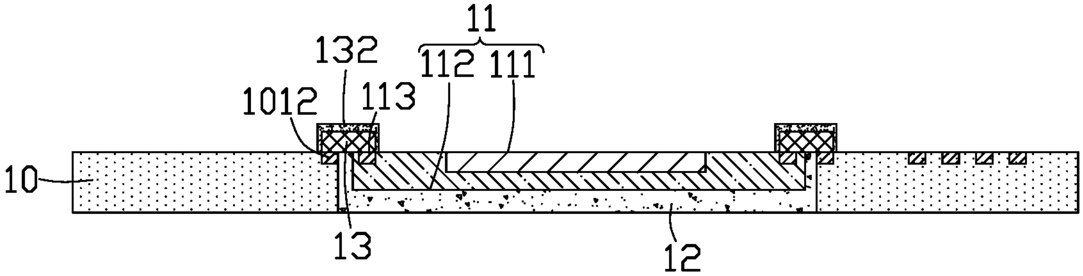
FIG. 17 is a cross-sectional view illustrating an insulating layer covering the wires in FIG. 16.

Referring to FIG. 17, in at least one embodiment, the block 604 may further include covering the wires 13 by an insulating layer 132 to improve conduction reliability.

Figure 18:
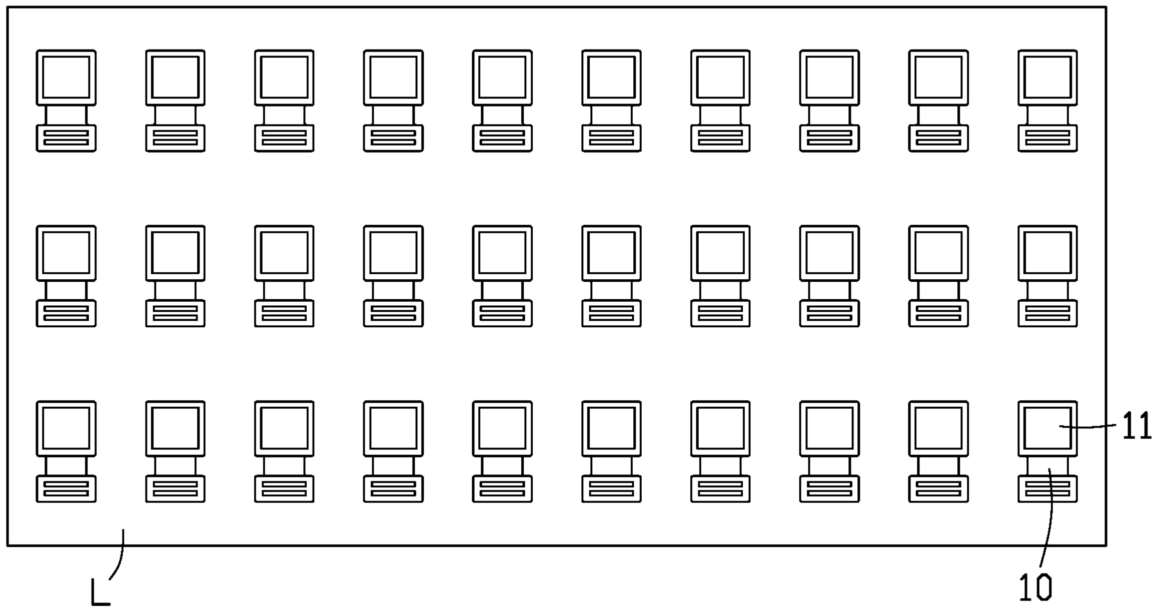
FIG. 18 is a diagram illustrating a circuit connection board according to an embodiment of the present disclosure.
Figure 19:
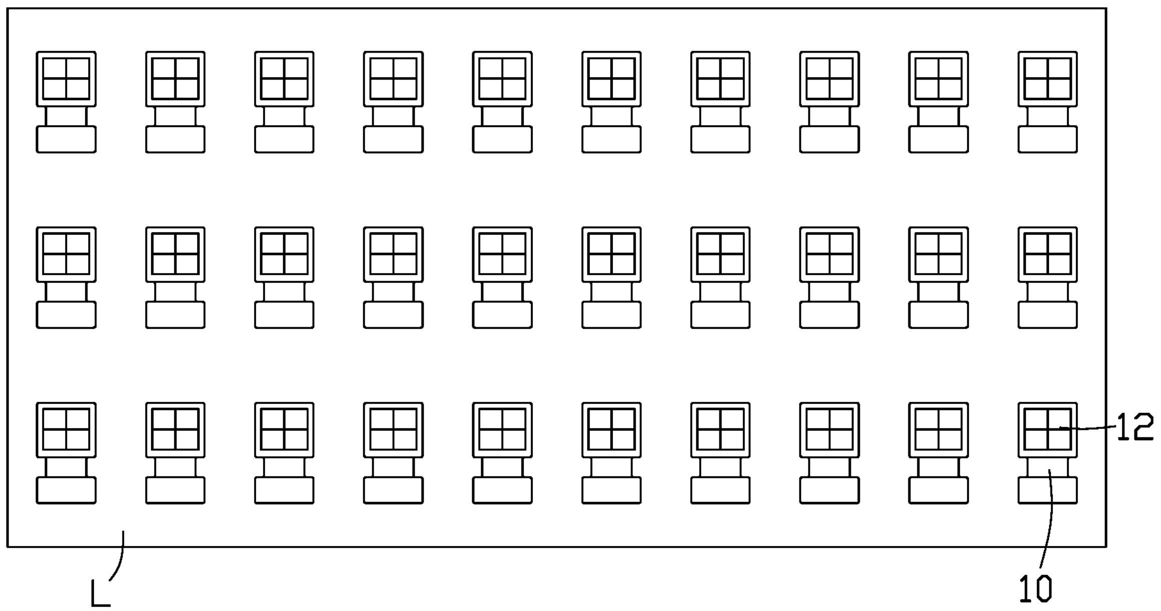
FIG. 19 is a diagram illustrating the circuit connection board from another angle according to an embodiment in FIG. 18.
Figure 20:
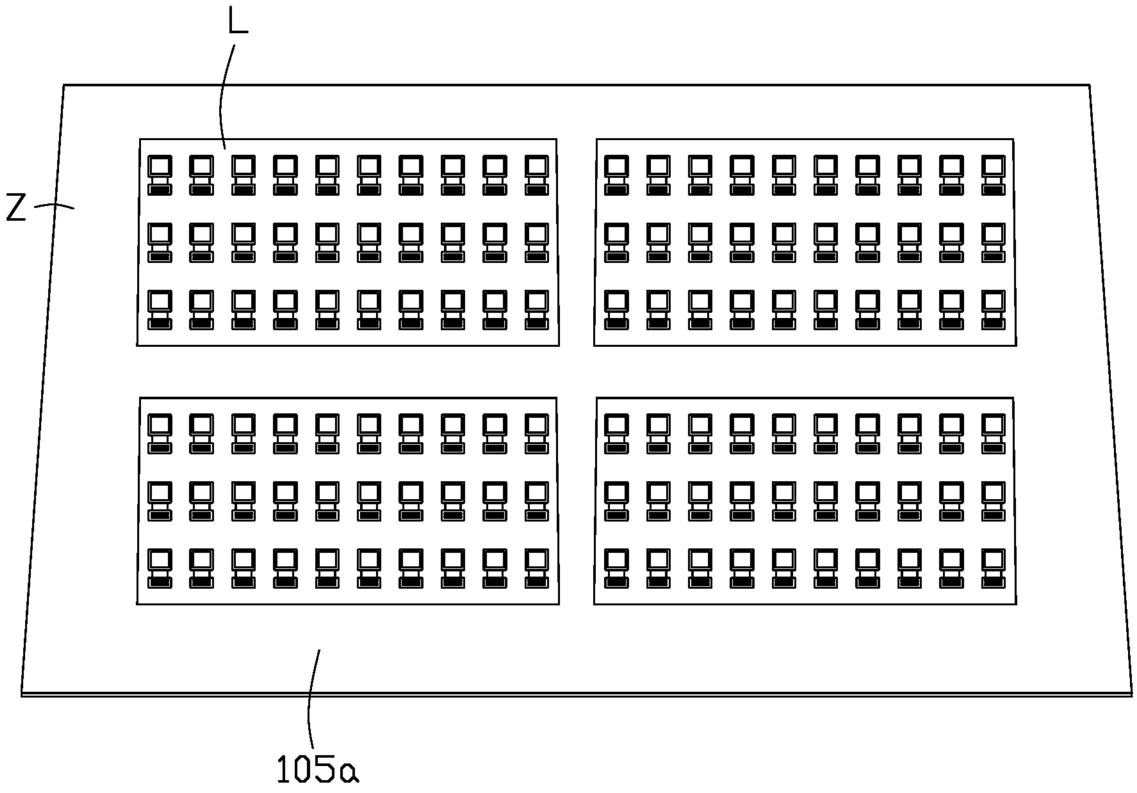
FIG. 20 is a diagram illustrating circuit connection boards on a carrier according to an embodiment of the present disclosure.

In at least one embodiment, referring to FIG. 18, FIG. 19, and FIG. 20, the circuit board-to-board process may be used to manufacture multiple circuit boards at the same time, and it can control imaging surfaces or emitting surfaces of dual or more modules to be on the same plane to obtain better quality optical modules. In at least one embodiment, a circuit connection board L may include a plurality of circuit boards. After each of the circuit boards is provided with a receiving hole, the circuit connection board L is placed on a surface of a carrier Z, and the surface of the carrier Z is provided with a weakly adhesive peelable film 105*a*. Each of the circuit boards 10 of the circuit connection board L is processed separately, and finally cut and separated.

At block 605, referring to FIG. 1, at least one electronic component 14 are arranged on the first surface 101*a*, thereby obtaining the semiconductor packaging assembly 100.

The at least one electronic component 14 may be soldered to the at least one second welding pad 1013 by surface mount technology (SMT). The at least one electronic component 14 may be an active component or a passive component.

Depending on the embodiment, certain of the steps of methods described may be removed, others may be added, and the sequence of steps may be altered. It is also to be understood that the description and the claims drawn to a method may include some indication in reference to certain steps. However, the indication used is only to be viewed for identification purposes and not as a suggestion as to an order for the steps.

Figure 21:
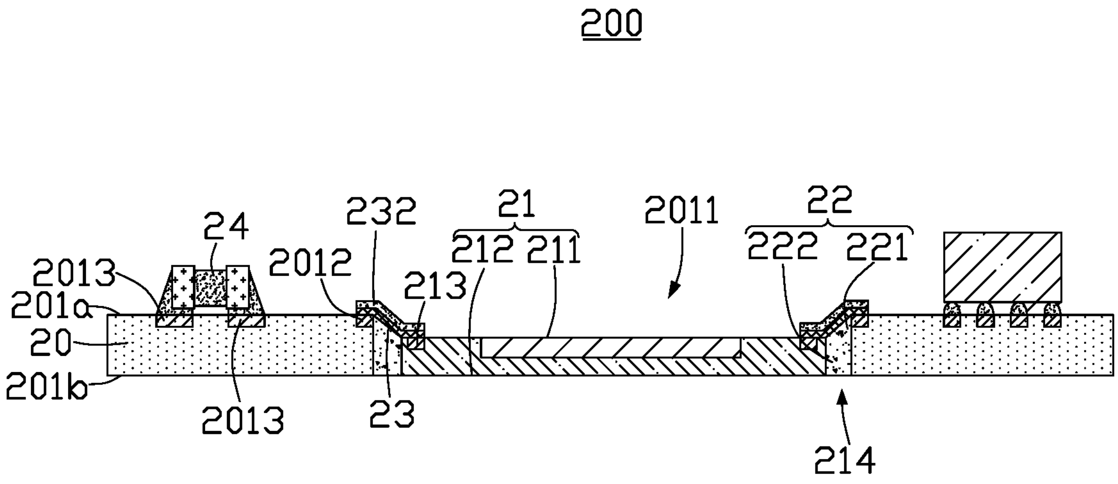
FIG. 21 is a cross-sectional view illustrating a semiconductor packaging assembly according to a second embodiment of the present disclosure.

FIG. 21 illustrates a second embodiment of a semiconductor packaging assembly 200. The semiconductor packaging assembly 200 is different from the semiconductor packaging assembly 100 of the first embodiment in that the active surface 211 of each of the at least one chip 11 is located between the first surface 201*a* and the second surface 201*b*, the packaging body 22 only fills the gap 214 between the chip 21 and the circuit board 20, the third surface 221 of the packaging body 22 is an inclined surface connecting the first surface 201*a* and the active surface 111, the passive surface 212 of the at least one chip 21, the second surface 201*b* of the circuit board 20, and the fourth surface 222 of the packaging body 22 may be flush with each other.

Figure 22:
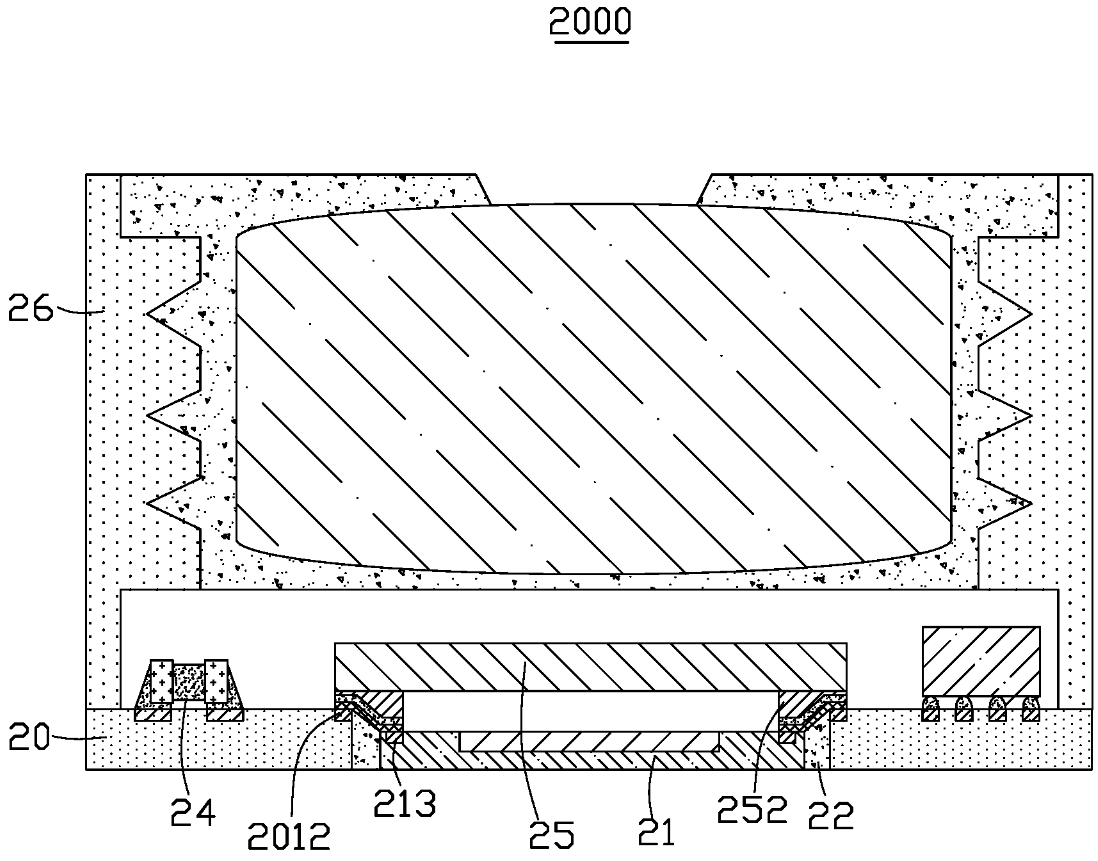
FIG. 22 is a cross-sectional view illustrating an opto-electromechanical device according to a second embodiment of the present disclosure.

FIG. 22 illustrates a second embodiment of an opto-electromechanical device 2000 having the semiconductor packaging assembly 200.

Figure 23A:
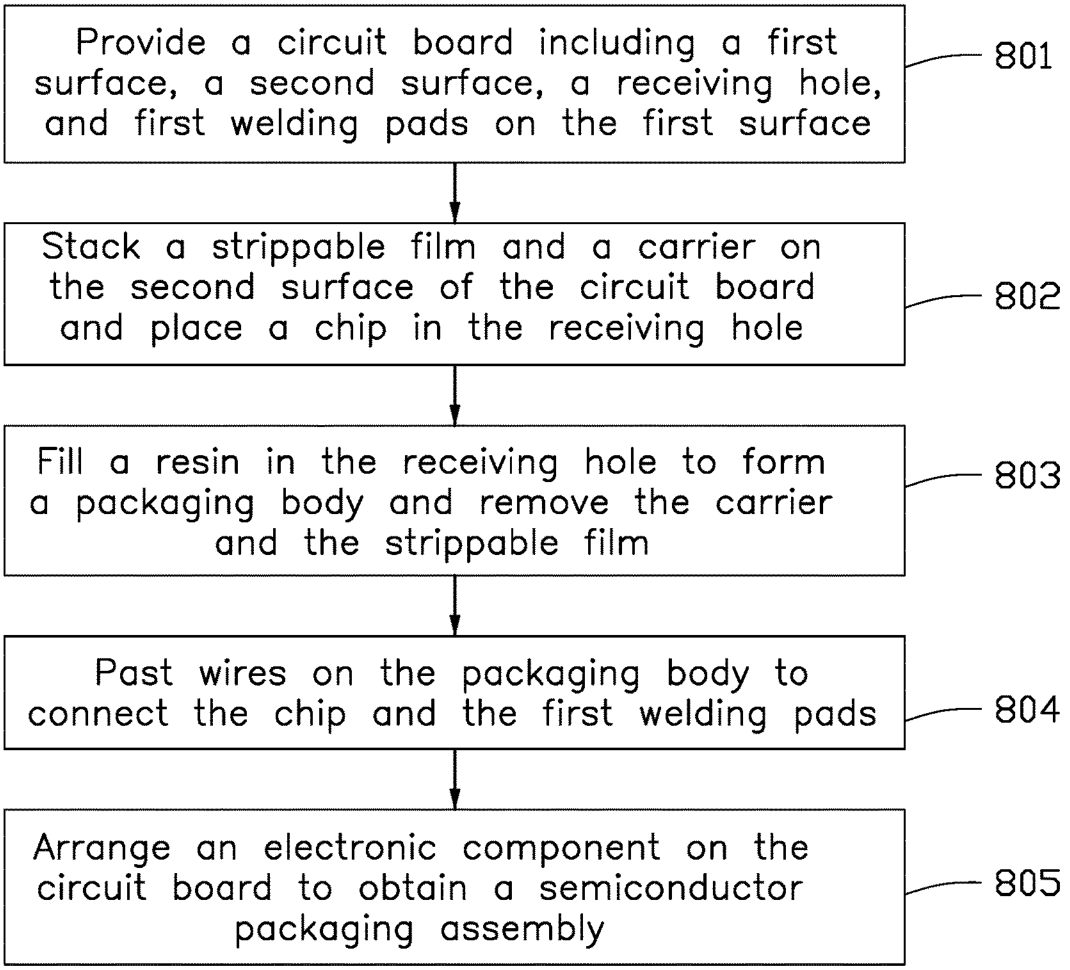
FIG. 23A is a flowchart illustrating a method for manufacturing a semiconductor packaging assembly according to a second embodiment of the present disclosure.

FIG. 23A illustrates a flowchart of a method in accordance with a first embodiment. The first embodiment method for manufacturing a semiconductor packaging assembly 100 (shown in FIG. 21) is provided by way of embodiments, as there are a variety of ways to carry out the method. Each block shown in FIG. 23A represents one or more processes, methods, or subroutines carried out in the method. Furthermore, the illustrated order of blocks can be changed. Additional blocks may be added or fewer blocks may be utilized, without departing from this disclosure. The method can begin at block 801.

Figure 23B:
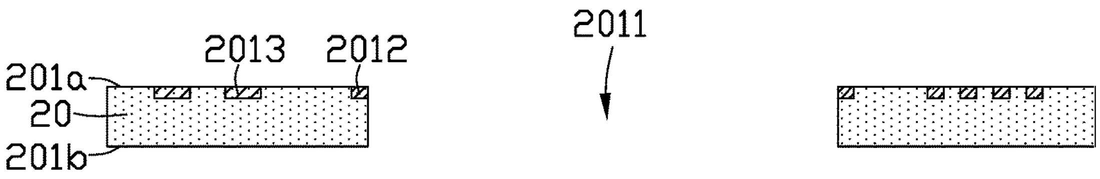
FIG. 23B is a cross-sectional view illustrating a circuit board according to a second embodiment of the present disclosure.

At block 801, referring to FIG. 23B, a circuit board 20 is provided and at least one receiving hole 2011 penetrates a first surface 201*a* of the circuit board 10 and a second surface 201*b* of the circuit board 10 facing away from the first surface 201*a*. A plurality of the first welding pads 2012 are provided on the first surface 201*a*.

The first surface 201*a* may be provided with at least one second welding pad 2013 spaced apart from the plurality of the first welding pads 2012.

Figure 24:
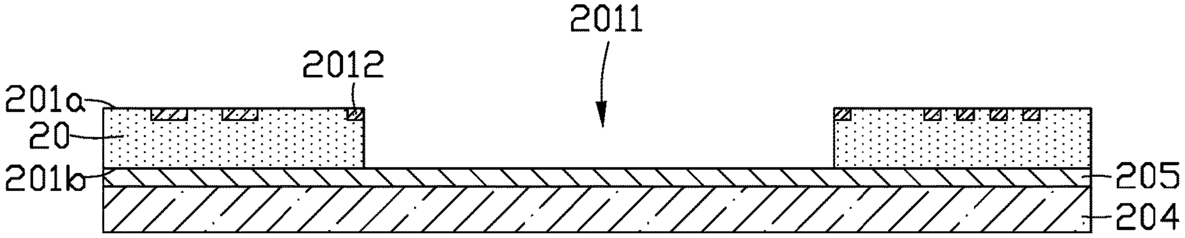
FIG. 24 is a cross-sectional view illustrating a carrier stacked with the circuit board in FIG. 23B.
Figure 25:
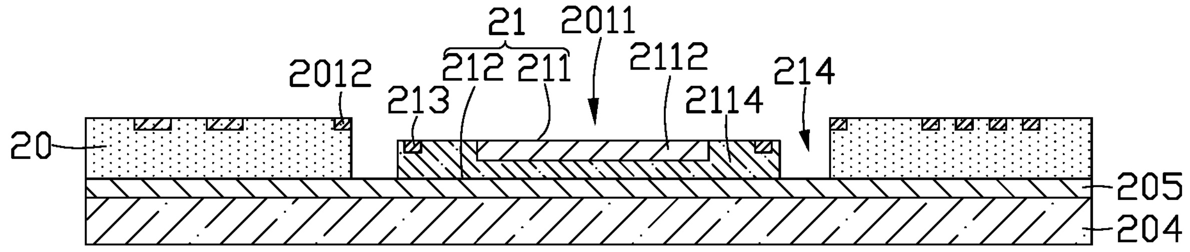
FIG. 25 is a cross-sectional view illustrating a chip in a receiving hole in FIG. 24.

At block 802, referring to FIG. 24 and FIG. 25, a strippable film 205 and a carrier 204 are stacked in sequence on the second surface 201*b* of the circuit board 20, and at least one chip 21 is placed in the at least one receiving hole 2011.

Each of the at least one chip 21 includes an active surface 211 facing the strippable film 205 and a passive surface 212 facing away from the active surface 211. The active surface 211 may include a sensing region 2112 and a non-sensing region 2114. The non-sensing region 2114 may surround the sensing region 2112 and extend from a periphery of the sensing region 2112. The non-sensing region 2114 may be provided with a plurality of pins 213 spaced apart from each other. The sensing region 2112 may be located at a center of the active surface 211. The plurality of pins 213 may be arranged at an edge of the non-sensing region 2114 away from the sensing region 2112. The plurality of first welding pads 2012 may be arranged at an edge of the first surface 201*a* close to the at least one chip 21. Each of the plurality of pins 213 may be adjacent to one of the plurality of first welding pads 2012.

The at least one chip 21 received in the at least one receiving hole 2011 is spaced from the circuit board 20 by a gap 214. In at least one embodiment, the active surface 211 is lower than the first surface 201*a* of the circuit board 20, that is, the active surface 211 is located between the first surface 201*a* and the second surface 201*b*.

Figure 26:
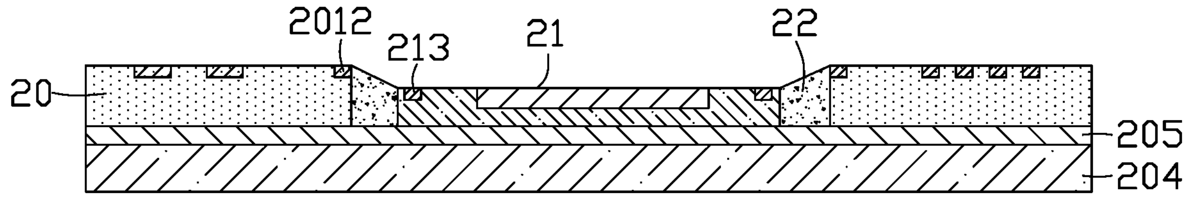
FIG. 26 is a cross-sectional view illustrating a packaging body in the receiving hole in FIG. 25.
Figure 27:
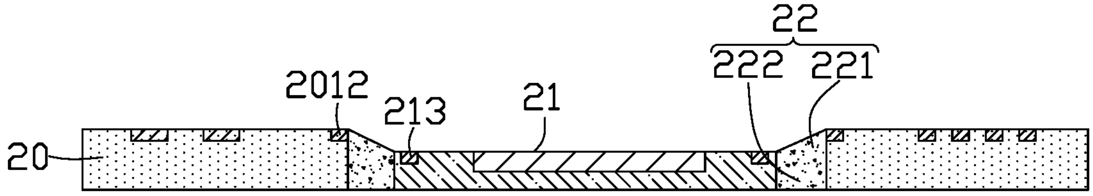
FIG. 27 is a cross-sectional view illustrating the circuit board with the chip and the packaging body after removing the carrier in FIG. 26.

At block 803, referring to FIG. 26 and FIG. 27, a resin is filled in the gap 214 to form a packaging body 22 bonded to the chip 21 and an inner surface of the circuit board 20 defining the receiving hole 2011, and the carrier 204 and the strippable film 205 are removed from the circuit board 20.

Figure 28:
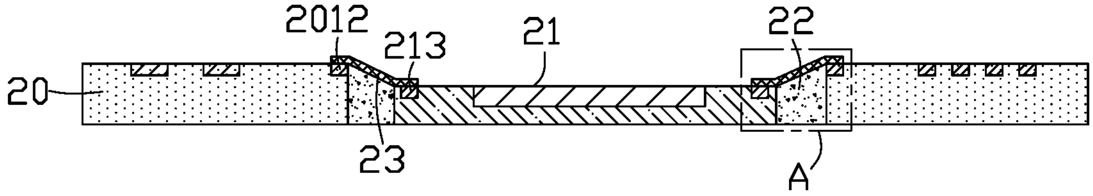
FIG. 28 is a cross-sectional view illustrating wires on the packaging body in FIG. 27.
Figure 29:
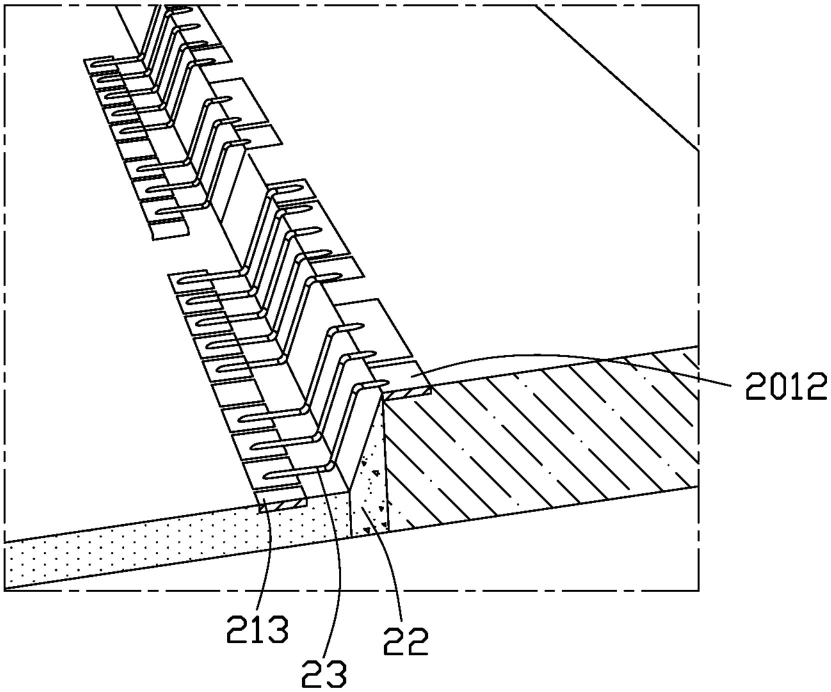
FIG. 29 is an enlarger schematic diagram illustrating a partial area A in FIG. 28.

At block 804, referring to FIG. 28 and FIG. 29, wires 23 are pasted on the third surface 221 of the packaging body 22, and each of the wires 23 electrically connects one of the plurality of pins 213 and one of the plurality of first welding pads 2012.

Figure 30:
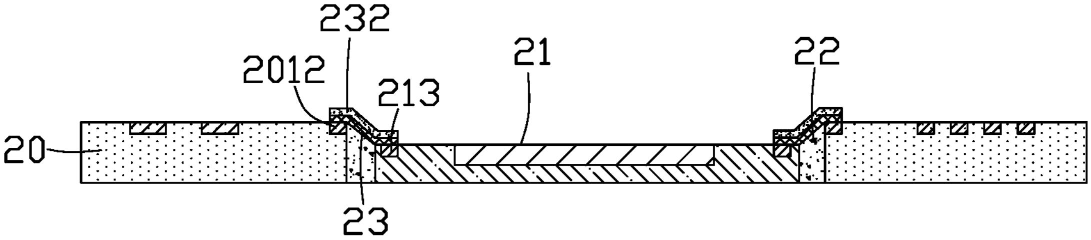
FIG. 30 is a cross-sectional view illustrating an insulating layer covering the wires in FIG. 28.

In at least one embodiment, referring to FIG. 30, the block 804 may further include covering the wires 23 by an insulating layer 232 to improve conduction reliability.

At block 805, referring to FIG. 21, at least one electronic component 24 are arranged on the first surface 201*a*, thereby obtaining the semiconductor packaging assembly 200.

The at least one electronic component 24 may be soldered to the at least one second welding pad 2013 by surface mount technology (SMT). The at least one electronic component 24 may be an active component or a passive component.

Figure 31:
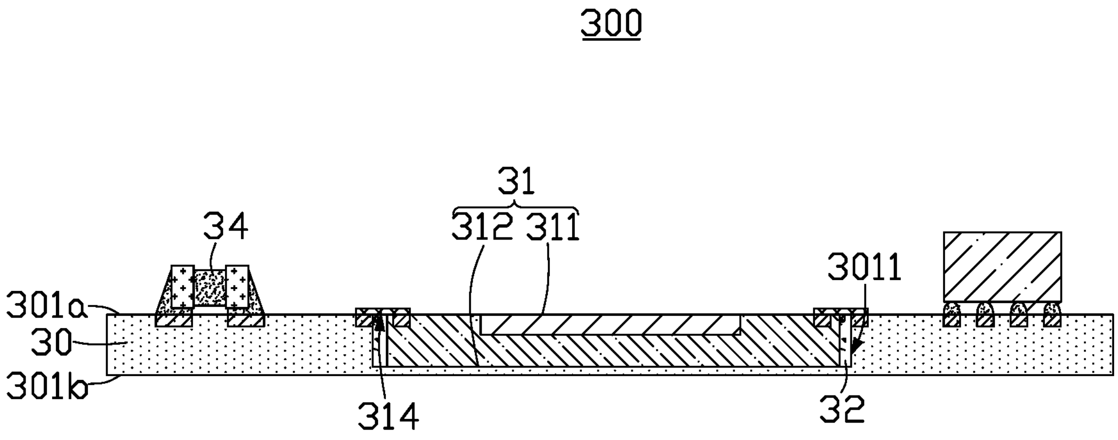
FIG. 31 is a cross-sectional view illustrating a semiconductor packaging assembly according to a third embodiment of the present disclosure.

FIG. 31 illustrates a third embodiment of a semiconductor packaging assembly 300. The semiconductor packaging assembly 300 is different from the semiconductor packaging assembly 100 of the first embodiment in that each of the at least one receiving hole 3011 is a blind hole and recessed from the 301*a* of the circuit board 30 toward the second surface 301*b* of the circuit board 30. The at least one chip 31 is received in the at least one receiving hole 3011, and the passive surface 312 of each of the at least one chip 31 is attached to a bottom wall of the receiving hole 3011. The packaging body 32 one fills the gap 314 between the at least one chip 31 and the circuit board 30.

An adhesive layer (not shown) may be provided between the passive surface 312 of the at least one chip 31, for example, the at least one chip 30 may be bonded to the bottom wall of the circuit board 30 by a die attach film (DAF).

Figure 32:
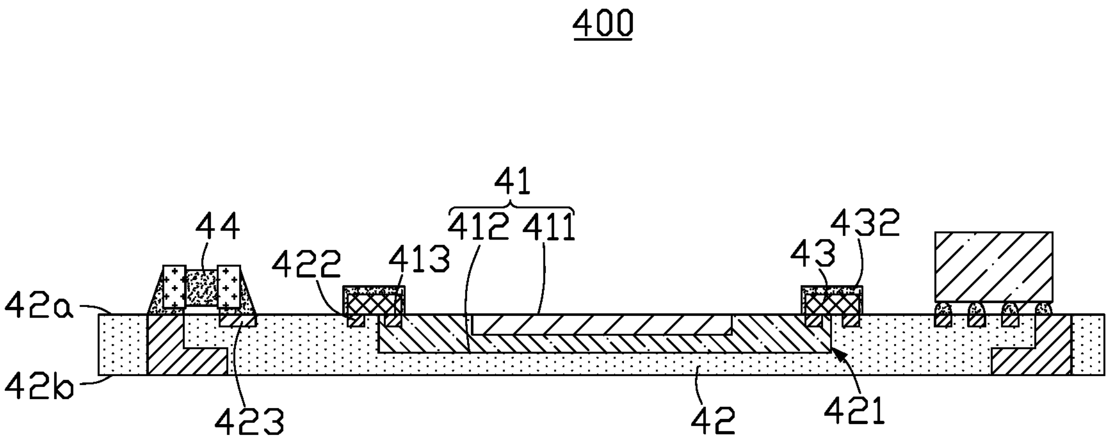
FIG. 32 is a cross-sectional view illustrating a semiconductor packaging assembly according to a fourth embodiment of the present disclosure.

FIG. 32 illustrates a second embodiment of a semiconductor packaging assembly 400. The semiconductor packaging assembly 400 is different from the semiconductor packaging assembly 100 of the first embodiment in that the semiconductor packaging assembly 400 does not include the circuit board 10, the packaging body 42 wraps the passive surface 412 of each of the at least one chip 41 and a side surface of each of the at least one chip 41 connecting the active surface 411 and the passive surface 412.

The packaging body 42 includes a third surface 42*a* and a fourth surface 42*b* facing away from the third surface 42*a*. The active surface 411 of the at least one chip 41 may be flush with the third surface 42*a*. At least one receiving hole 421 is recessed from the third surface 42*a* toward the fourth surface 42*b*, and the at least one chip 41 is received in the at least one receiving hole 421. An edge of the third surface 42*a* close to the at least one chip 41 is provided with a plurality of first welding pads 422 and at least one second welding pad 423. One of plurality of pins 413 of the at least one chip 41 and one of the plurality of first welding pads 422 are connected through a wire 43. At least one electronic component 44 is soldered on the third surface 42*a* through the at least one second welding pad 423.

In at least embodiment, firstly, the at least one chip 41 is placed upside down on a carrier (that is, the active surface 411 faces the carrier), then a resin is filled to wrap the at least one chip 41 to form the packaging body 42, finally the carrier is removed. The plurality of first welding pads 422 and the at least one second welding pad 423 are formed by performing a redistribution layer (RDL) process on the packaging body 42, and then the wires 43 and the at least one electronic component 44 are arranged.

It is to be understood, even though information and advantages of the present embodiments have been set forth in the foregoing description, together with details of the structures and functions of the present embodiments, the disclosure is illustrative only; changes may be made in detail, especially in matters of shape, size, and arrangement of parts within the principles of the present embodiments to the full extent indicated by the plain meaning of the terms in which the appended claims are expressed.

What is claimed is:

1. A semiconductor packaging assembly comprising:

a circuit board comprising a first surface, a second surface facing away from the first surface, at least one receiving hole recessed from the first surface toward the second surface, each of the at least one receiving hole having a same size, and a plurality of first welding pads on the first surface;

at least one chip received in the at least one receiving hole and spaced apart from the circuit board by a gap, wherein each of the at least one chip comprises an active surface facing away from the second surface, a passive surface facing away from the active surface, and a plurality of pins arranged on the active surface;

a packaging body in the gap and bonded to the at least one chip and the circuit board, the packaging body further covering the passive surface of the at least one chip, the packaging body comprising a third surface facing away from the second surface and a fourth surface facing away from the third surface; and wires attached to the third surface of the packaging body, and each of the wires electrically connected to at least one of the plurality of pins and at least one of the plurality of first welding pad;

wherein each of the at least one receiving hole penetrates the first surface and the second surface; the active surface of the at least one chip, the first surface of the circuit board, and the third surface of the packaging body are flush with each other, the fourth surface of the packaging body is flush with the second surface of the circuit board.

2. The semiconductor packaging assembly of claim 1, wherein the plurality of first welding pads is arranged at an edge of the first surface close to the at least one chip, the plurality of pins is arranged at an edge of the active surface, and each of the plurality of pins is adjacent to one of the plurality of first welding pads.

3. The semiconductor packaging assembly of claim 1, further comprising an insulating layer covering the wires and bonded to the third surface, wherein the wires are located between the insulating layer and the third surface.

4. The semiconductor packaging assembly of claim 1, wherein a first metal block is arranged on each of the plurality of first welding pads, a second metal block is arranged on each of the plurality of pins, the semiconductor packaging assembly further comprises an insulating layer wraps the first metal blocks on the plurality of first welding pads and the second metal blocks on the plurality of pins, an end portion of each of the first metal blocks and an end portion of each of the second metal blocks are exposed from a surface of the insulating layer facing away from the circuit board, the wires are arranged on the surface of the insulating layer facing away from the circuit board and each of the wires is electrically connected to the end portion of one of the first metal blocks and the end portion of one of the second metal blocks.

5. A semiconductor packaging assembly comprising:

at least one chip, each of the at least one chip comprising an active surface, a passive surface facing away from the active surface, and a plurality of pins on the active surface;

a packaging body wrapping the passive surface of the at least one chip and a side surface of the at least one chip connecting the passive surface and the active surface, the packaging body comprising a third surface facing away from the passive surface and a plurality of first welding pads arranged on the third surface; and wires attached to the third surface of the packaging body and each of the wires electrically connected to at least one of the plurality of pins and at least one of the plurality of first welding pads.

6. An opto-electromechanical device comprising the semiconductor packaging assembly of claim 5.

7. The opto-electromechanical device of claim 6, further comprising an optical element and a colloid, wherein the optical element is bonded to a junction of the packaging body and the at least one chip through the colloid, and the optical element is spaced apart from the at least one chip.

8. An opto-electromechanical device comprising:

a semiconductor packaging assembly comprising:

a circuit board comprising a first surface, a second surface facing away from the first surface, at least one receiving hole recessed from the first surface toward the second surface, each of the at least one receiving hole having a same size, and a plurality of first welding pads on the first surface;

at least one chip received in the at least one receiving hole and spaced apart from the circuit board by a gap, wherein each of the at least one chip comprises an active surface facing away from the second surface and a passive surface facing away from the active surface, a plurality of pins arranged on the active surface;

a packaging body in the gap and bonded to the at least one chip and the circuit board, the packaging body further covering the passive surface of the at least one chip the packaging body comprising a third surface and a fourth surface facing away from the third surface; and wires attached to the third surface of the packaging body, and each of the wires electrically connected to at least one of the plurality of pins and at least one of the plurality of first welding pads;

wherein each of the at least one receiving hole penetrates the first surface and the second surface; the active surface of the at least one chip, the first surface of the circuit board, and the third surface of the packaging body are flush with each other, the fourth surface of the packaging body is flush with the second surface of the circuit board.

9. The opto-electromechanical device of claim 8, wherein the plurality of first welding pads is arranged at an edge of the first surface close to the at least one chip, the plurality of pins is arranged at an edge of the active surface, and each of the plurality of pins is adjacent to one of the plurality of first welding pads.

10. The opto-electromechanical device of claim 8, further comprising an insulating layer covering the wires and bonded to the third surface, wherein the wires are located between the insulating layer and the third surface.

11. The opto-electromechanical device of claim 8, wherein a first metal block is arranged on each of the plurality of first welding pads, a second metal block is arranged on each of the plurality of pins, the semiconductor packaging assembly further comprises an insulating layer wraps the first metal blocks on the plurality of first welding pads and the second metal blocks on the plurality of pins, an end portion of each of the first metal blocks and an end portion of each of the second metal blocks are exposed from a surface of the insulating layer facing away from the circuit board, and the wires are arranged on the surface of the insulating layer facing away from the circuit board and each of the wires is electrically connected to the end portion of one of the first metal blocks and the end portion of one of the second metal blocks.

12. The opto-electromechanical device of claim 8, further comprising an optical element and a colloid, wherein the optical element is bonded to a junction of the circuit board and the at least chip through the colloid, and the optical element is spaced apart from the at least one chip.

* * * * *